(12) United States Patent
Hirata et al.

(10) Patent No.: US 6,392,258 B1
(45) Date of Patent: May 21, 2002

(54) HIGH SPEED HETEROJUNCTION BIPOLAR TRANSISTOR, AND RF POWER AMPLIFIER AND MOBILE COMMUNICATION SYSTEM USING THE SAME

(75) Inventors: Koji Hirata, Kodaira; Hiroyuki Takazawa, Hino, both of (JP)

(73) Assignees: Hitachi, Ltd.; Hitachi ULSI Systems Co., Ltd., both of Tokyo (JP)

( * ) Notice: Subject to any disclaimer, the term of this patent is extended or adjusted under 35 U.S.C. 154(b) by 0 days.

(21) Appl. No.: 09/516,160

(22) Filed: Feb. 29, 2000

(30) Foreign Application Priority Data

Mar. 11, 1999 (JP) ............................................. 11-065253

(51) Int. Cl.[7] ............................................. H01L 29/737
(52) U.S. Cl. ........................................ 257/197; 257/198
(58) Field of Search ................................... 257/197, 198

(56) References Cited

U.S. PATENT DOCUMENTS

| | | | | |
|---|---|---|---|---|
| 5,552,617 A | * | 9/1996 | Hill et al. .................... | 257/198 |
| 5,682,046 A | * | 10/1997 | Takahashi et al. ........... | 257/198 |
| 5,719,415 A | * | 2/1998 | Yagura et al. ............... | 257/197 |
| 5,837,589 A | * | 11/1998 | McNamara et al. ........ | 257/197 |
| 5,907,165 A | * | 5/1999 | Hamm et al. ................ | 257/197 |
| 6,043,520 A | * | 3/2000 | Yamamoto et al. ......... | 257/198 |

* cited by examiner

*Primary Examiner*—Gene M. Munson
(74) *Attorney, Agent, or Firm*—Antonelli, Terry, Stout & Kraus, LLP

(57) ABSTRACT

To provide a super high-speed heterojunction bipolar transistor, a semiconductor device including such a heterojunction bipolar transistor has a structure wherein a subcollector layer, collector layer, base layer, emitter layer (InGaP layer) and emitter cap layer are successively formed in predetermined shapes a surface of a semi-insulating GaAs substrate, an inner edge part of a base electrode overlaps a periphery of the emitter layer, and the base electrode is electrically connected to the base layer by an alloy layer formed by alloying the emitter layer under the base electrode. The emitter layer is selectively formed on the base layer. The base electrode extends from the peripheral part of the emitter layer across the base layer, and the alloy layer extends to a midway depth of the base layer. The edge of the base layer is situated further inside than the outer edge of the base electrode.

9 Claims, 9 Drawing Sheets

HIGH SPEED HETEROJUNCTION BIPOLAR TRANSISTOR, AND RF POWER AMPLIFIER AND MOBILE COMMUNICATION SYSTEM USING THE SAME

BACKGROUND OF THE INVENTION

1. Field of the Invention

This invention relates to a semiconductor device, a method of fabricating the same, an RF power amplifier and a mobile communication system, and, more particularly, to an effective technique which can be applied to a heterojunction bipolar transistor used as a device in a super high-speed IC.

2. Prior Art

A Heterojunction Bipolar Transistor, or HBT, is a semiconductor device having high speed and low power consumption. Typically, such HBTs are built into RF power amplifier modules of mobile communication terminals such as cellular telephones.

In an HBT, a subcollector layer and collector layer are successively laminated on one surface (the main surface) of a semiconductor substrate, a base layer is partially formed on this collector layer, and an emitter layer comprising a wide bandgap semiconductor is partially formed on this base layer.

An InGaP/GaAs HBT is known in the art which offers little degradation and high reliability, using an InGaP layer as the emitter layer to suppress the drop of gain due to recombination of minority carriers between the emitter and the base. In these HBTs, carbon (C), which does not easily move even at large currents, is used as a dopant in a p-type base layer.

This structure is disclosed as an example in the "International Electron Devices Meeting Digest", p.191, 1994 (High-Reliability InGaP/GaAs HBTs Fabricated Self-Aligned Process).

In this reference, an HBT is disclosed wherein a thin emitter layer is left on the base layer to improve reliability, a base electrode is formed thereon, and an (alloyed) ohmic electrode is formed via this thin emitter layer. During mesa-etching of the base part, the emitter layer, base layer and collector layer are etched by reactive ion etching (RIE) using the base electrode as a mask.

In Japanese Unexamined Patent Publication No. H9-102502, an HBT (GaAs type HBT wherein the emitter layer is InGaP) is disclosed wherein the base electrode, which comes in contact with the base layer, covers the edge of the emitter layer to suppress junction damage. In this construction, ohmic contact is obtained between the base electrode and base layer without the use of alloys.

Further, in Japanese Unexamined Patent Publication No. H9-36131, a technique (GaAs type HBT wherein the emitter is AlGaAs) is disclosed wherein, when the base layer is etched, wet etching is prolonged and the base-collector junction surface area is decreased by side etching to the underside of the base electrode in order to decrease the base-collector capacitance.

An identical technique for decreasing the base-collector capacitance is disclosed in Japanese Unexamined Patent Publication No. H8-195400.

As described in the above references, in order to achieve high speed in an AlGaAs/GaAs type HBT, it is important to decrease the base-collector junction area in order to decrease the base-collector capacitance. To decrease the base-collector capacitance, when the base layer (or base layer and collector layer) was etched in the prior art, a long etching time was allowed so that side etching proceeded to the underside of the base electrode (undercut technique).

The present invention pertains to developing an InGaP/GaAs type HBT wherein the emitter layer is InGaP. Also, in this HBT, high speed is desired as in the case of an AlGaAs/GaAs type HBT.

In order to decrease the base-collector capacitance, the base layer and collector layer were etched to the underside of the base electrode, but encounters the following problems were encountered in the course of this etching.

FIGS. 14–19 are diagrams describing a method of manufacturing a semiconductor device which the Inventor used prior to this application. As shown in FIG. 14, semiconductor layers are successively formed by epitaxial growth on one surface (the main surface) of a substrate (semiconductor substrate) 1 comprising semi-insulating GaAs. Starting from the substrate in an upward direction, these semiconductor layers comprise a subcollector layer 2 comprising n-type GaAs, a collector layer 3 comprising n type GaAs, a base layer 4 comprising p$^+$-type GaAs, an emitter layer 5 comprising n-type InGaP, and an emitter cap layer 6 comprising n-type GaAs. The emitter cap layer 6 may comprise a plurality of layers.

As shown in FIG. 14, a first electrode layer 8a is formed comprising the lower layer of an emitter electrode on the semiconductor layer which is the emitter cap layer 6. Etching is performed using this first electrode layer 8a as an etching mask, and the emitter cap layer 6 is formed such that the periphery lies further inside than the edge of the first electrode layer 8a. The first electrode layer 8a may, for example, comprise WSi.

Next, as shown in FIG. 15, a photoresist mask is formed over the whole of the main surface of the semiconductor substrate 1, an electrode layer is formed, unnecessary parts of the electrode layer are selectively removed by a lift-off technique, and a second electrode layer 8b, which exactly overlaps the first electrode layer 8a, is formed on the emitter cap layer 6 so as to form an emitter electrode 7 comprising the first electrode layer 8a and the second electrode layer 8b. At the same time, a base electrode 9 is formed surrounding the emitter cap layer. As there is a large step between the surface of the emitter layer 5 and the surface of the first electrode layer 8a, the electrode layers break off in this step part, and as the edge of the first electrode layer 8a projects beyond the edge of the emitter cap layer 6, the base electrode 9 and the emitter cap layer 6 are situated at a fixed distance apart. These electrode layers are formed of Pt, Ti, Mo and Au or the like in a multi-layer arrangement.

Next, as shown in FIG. 16, a mask (etching mask) of an insulating film 10 is formed to cover the emitter electrode 7 and the base electrode 9, excepting the outer edge, and the InGaP emitter layer 5 is subjected to undercut etching by wet etching using hydrochloric acid as an etchant. As a result, the edge of the InGaP emitter layer 5 comes to be situated further inside than the edge of the base electrode 9.

Next, as shown in FIG. 17, the semiconductor layers comprising the base layer 4 and collector layer 3 are formed by undercut etching, i.e., wet etching using phosphoric acid as an etchant and using the aforesaid etching mask 10, base electrode 9, and emitter layer 5 as etching masks. Due to this undercut etching, the junction area between the base layer and collector layer is reduced, and the base-collector capacitance can be decreased.

However, in the aforesaid etching by hydrochloric acid, Ti and Mo, which are component materials of the base electrode become corroded causing degeneration of the electrode. Cracks appear in the mask 10 on the electrode due to the corrosion of Ti and Mo, and the InGaP emitter layer 5 between the cap layer 6 and the base electrode 9 is etched. All of these factors lead to a degeneration of performance.

Further, the InGaP layer around the base electrode 9 may not be completely removed and there may be InGaP etching residues (remnants 11), as shown in FIG. 18.

Further, in the wet etching using phosphoric acid, the remnants 11 act as a mask leading to etching defects 12 where the base layer and the collector layer under it are not etched, as shown in FIG. 19. As a result, the base-collector capacitance increases and the uniformity of the base-collector capacitance decreases. This impairs the performance and decreases the reproducibility of the heterojunction bipolar transistor.

SUMMARY OF THE INVENTION

It is therefore an object of this invention to provide a heterojunction bipolar transistor with high speed, and a method of fabricating the same.

It is a further object of this invention to provide a technique for reducing the degeneration of a base electrode and emitter layer during etching which is performed to reduce a base-collector junction area of the heterojunction bipolar transistor.

It is a further object of this invention to provide a technique for carrying out etching which is performed to reduce the base-collector junction area of the heterojunction bipolar transistor with high precision and good reproducibility.

It is yet a further object of this invention to provide an RF power amplifier incorporating an HBT having good characteristics and high reliability.

These and other novel features of this invention will become apparent from the following description and appended drawings.

The essential features of the invention disclosed in this application may be briefly described as follows:

(1) In a semiconductor device comprising a heterojunction bipolar transistor which includes a subcollector layer, collector layer, base layer, emitter layer and emitter cap layer successively formed in predetermined shapes on one surface of a semiconductor substrate, the transistor having a structure wherein an inner edge part of a base electrode overlaps the periphery of the emitter layer, and the base electrode is electrically connected to the base layer by an alloy layer formed by alloying the emitter layer under the base electrode, the emitter layer is selectively formed on the base layer, the base electrode extends from the peripheral part of the emitter layer to the base layer, and the alloy layer extends to a midway depth of the base layer. The edge of the base layer is situated further inside than the outer edge of the base electrode. The semiconductor substrate is formed of a semi-insulating GaAs substrate, the subcollector layer and collector layer are formed of an n-type GaAs layer, the base layer is formed of a p-type GaAs layer, the emitter layer is formed of an n-type InGaP layer, and the emitter cap layer is formed of an n-type GaAs layer. The emitter layer formed of InGaP has a thickness of 15 to 30 nm. The cover part of the emitter electrode is formed of an electrode layer forming the base electrode. The base electrode is formed of Pt/Ti/Mo/Ti/Pt/Au, having Pt as the lowermost layer. Also, if the thickness of the InGaP emitter layer is $t_E$, the thickness of the base layer is $t_B$, and the thickness of the Pt of the lowermost layer of the base electrode is $t_{Pt}$, the relations $t_{Pt} \geq 2t_E$, and $t_B > 2t_{Pt}$ are satisfied.

This semiconductor device is fabricated by the following method:

This method of fabricating the semiconductor device, a heterojunction bipolar transistor is fabricated by successively forming semiconductor layers comprising a subcollector layer, collector layer, base layer, emitter layer and emitter cap layer on one surface of a semiconductor substrate. The subcollector layer, collector layer, base layer, emitter layer and emitter cap layer are formed by etching predetermined semiconductor layers of the semiconductor layers in a predetermined pattern, an emitter electrode is formed on the emitter layer, a base electrode is formed whereof an inner edge part overlaps the periphery of the emitter layer, a collector electrode is formed on the collector layer, and the base electrode is electrically connected to the base layer via an alloy layer by alloying the emitter layer under the base electrode. This method comprises the steps of:

successively forming the semiconductor layers comprising the subcollector layer, collector layer, base layer, emitter layer and emitter cap layer on one surface of the semiconductor substrate;

selectively forming a first electrode layer comprising the emitter electrode on the semiconductor layer which is the emitter cap layer;

forming the emitter cap layer so that its periphery lies further inside than the edge of the emitter electrode by etching the semiconductor layer which is the emitter cap layer using the first electrode layer as an etching mask;

forming an etching mask to cover the first electrode layer comprising the emitter cap layer and the emitter electrode, and then forming the emitter layer by etching the semiconductor layer which is the emitter layer;

removing the etching mask, forming a photoresist mask on the whole of one surface of said semiconductor substrate, forming an electrode layer and lifting off unnecessary parts, forming the base electrode by an electrode layer extending from the periphery of the emitter layer to the semiconductor layer which is the base layer, and forming the emitter electrode by the first electrode layer and a second electrode layer comprising the electrode layer which exactly overlaps the first electrode layer; and forming an etching mask so that the outer edge of the base electrode is exposed and the emitter layer and emitter electrode are covered, and undercut etching the semiconductor layers which are the base layer and collector layer.

The subcollector layer comprising an n-type GaAs layer, the collector layer comprising an n-type GaAs layer, the base layer comprising a p-type GaAs layer, the emitter layer comprising an n-type InGaP layer, and the emitter cap layer comprising an n-type GaAs layer are successively formed on one surface of a semiconductor substrate comprising a semi-insulating GaAs substrate. The emitter layer is etched by wet etching using hydrochloric acid as an etchant, and the collector layer and subcollector layer are etched by wet etching using phosphoric acid as an etchant. The emitter layer comprising InGaP is formed to a thickness of the order of 15–30 nm. The base electrode is formed from Pt/Ti/Mo/Ti/Pt/Au, having Pt as the lowermost layer. The layers are formed so that, if the thickness of the InGaP emitter layer is $t_E$, the thickness of the base layer is $t_B$, and the thickness of the Pt of the lowermost layer of the base electrode is $t_{Pt}$, the relations $t_{Pt} \geq 2t_E$, and $tB > 2t_{Pt}$ are satisfied.

(2) In the heterojunction bipolar transistor having the construction of the aforesaid means (1), the edge of the base layer is situated further inside than the edge of the emitter layer, and the base electrode does not come in direct contact with the base layer.

In the method of fabricating the semiconductor device as described in the aforesaid means (1), when the base layer and the collector layer are subjected to undercut etching, the undercut etching is performed so that the edge of the base layer is situated further inside than the edge of the emitter layer, and the base electrode does not come in direct contact with the base layer.

(3) An RF power amplifier incorporating a heterojunction bipolar transistor of the aforesaid means (1) or (2).

(4) A mobile communication system incorporating the RF power amplifier of the aforesaid means (3).

According to the aforesaid means (1):

(a) As the InGaP emitter layer is etched with hydrochloric acid before forming the base electrode, the Mo or Ti of the base electrode is not easily corroded, and degeneration of the electrode does not easily occur.

It may be noted that corrosion of the base electrode does not occur during the etching with phosphoric acid, which is performed later.

(b) As the Ti or Mo is not easily corroded, surface degeneration of the base electrode does not easily occur, the mask on the electrode does not easily peel off, the InGaP emitter layer between the emitter cap layer and base electrode is not easily etched, and the impairment of the characteristics of the heterojunction bipolar transistor is reduced.

(c) As etching is not impaired by the substances produced by the corrosion of Ti or Mo, the InGaP emitter layer is etched to high precision according to the specifications of the etching mask, and the remnants of InGaP are not easily produced. As a result, undercut etching of the base layer and the collector layer by phosphoric acid can also be performed to high precision, and a base-collector capacitance can be formed according to design specifications. Therefore, a heterojunction bipolar transistor with very high speed can be provided.

(d) As corrosion of the base electrode does not easily occur and peeling of the etching mask does not easily occur during etching, the HBT fabrication process is stable, and as the yield is improved, the cost of manufacturing the semiconductor device can also be reduced.

(e) The base electrode is formed from the edge of the n-type InGaP emitter layer across the base layer, the n-type InGaP emitter layer under the base electrode is alloyed with the metal of the lowermost layer forming the base electrode, and the base electrode and base layer are thereby ohmically connected.

Further, on the side adjacent to the base-collector junction interface, the alloy layer is formed to a uniform depth which is less than the depth of the base layer, so the alloy layer does not come in contact with the collector layer, and the base-collector breakdown voltage of the device is maintained at a high level.

(f) As alloy is also formed in the surface direction of the n type InGaP emitter layer, the distance between the intrinsic region of the base layer part immediately beneath the emitter layer and the alloy layer is less than the distance to the base electrode, and as a result the base resistance RB is decreased, and the device THBT) can operate at high speed.

According to th e aforesaid means (2), in addition to the effect of the aforesaid means (1), the edge of the base layer is also closer to the center of the emitter layer so that the base electrode does not come in direct contact with the base layer, and a greater reduction of base-collector capacitance can be obtained.

According to the aforesaid means (3), an RF power amplifier having satisfactory speed characteristics and high reliability can be provided.

According to the aforesaid means (4), as the RF power amplifier operates at a high speed, a larger volume of information can be transmitted.

DETAILED DESCRIPTION OF THE PREFERRED EMBODIMENTS

Figure 1:
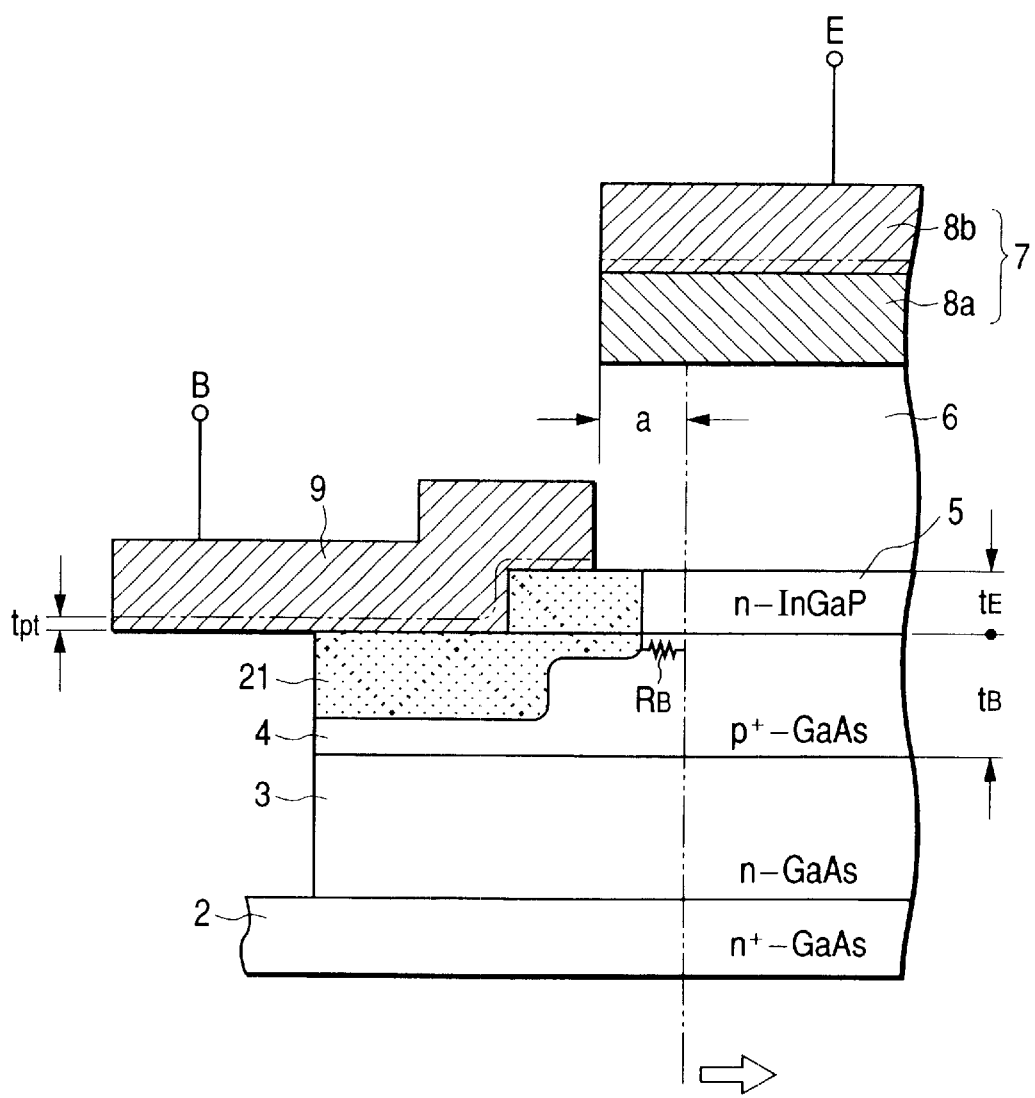
FIG. 1 is a schematic cross-sectional view showing one part of a heterojunction bipolar transistor (HBT) according to one embodiment (Embodiment 1) of this invention.

Some preferred embodiments of this invention will now be described in more detail, referring to the drawings. In all of the drawings used to describe the embodiments of the invention parts having the same function are assigned the same symbols, and their description will not be repeated.
(Embodiment 1)

FIGS. 1–9 are drawings relating to a heterojunction bipolar transistor (HBT) according to one embodiment (Embodiment 1) of the present invention.

Figure 2:
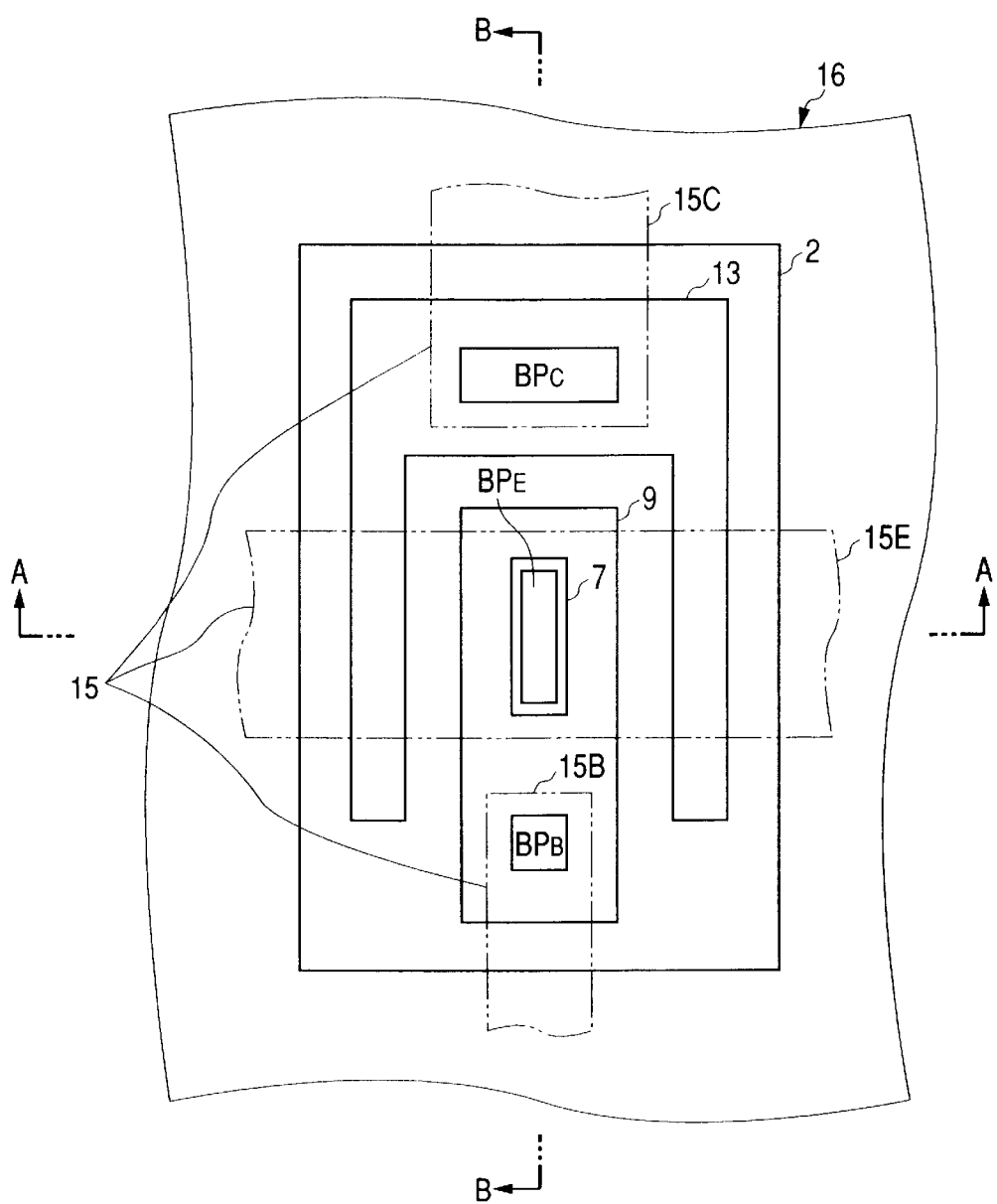
FIG. 2 is a schematic plan view of a semiconductor device comprising the HBT in the first embodiment.
Figure 3A:
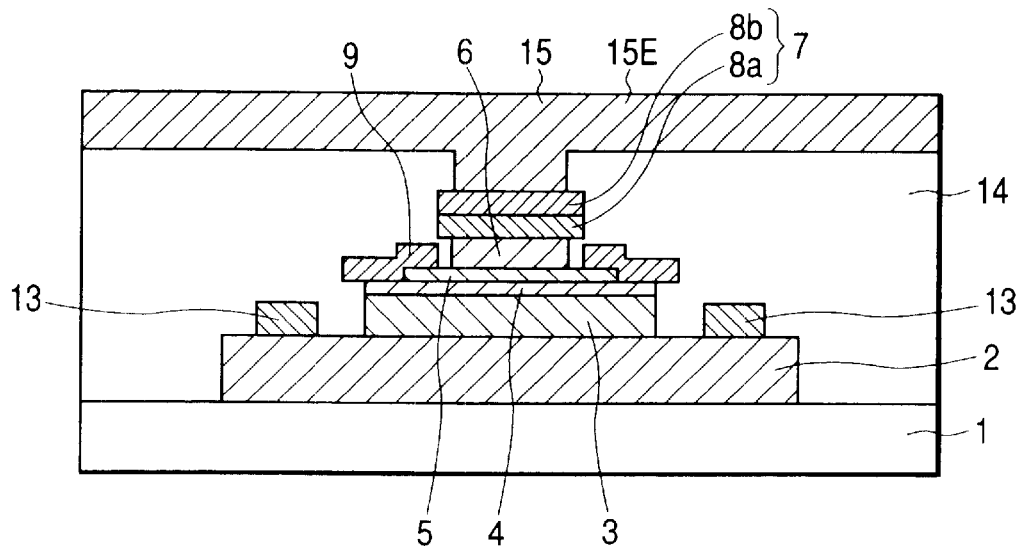
FIG. 3(a) is a cross-sectional view taken along a line A—A in FIG. 2.
Figure 3B:
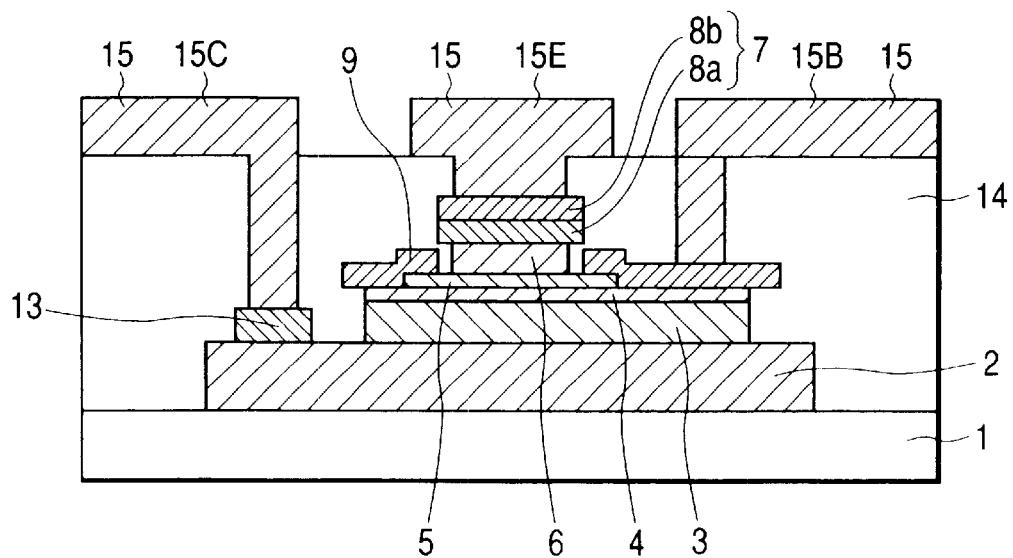
FIG. 3(b) is a cross-sectional view taken along a line B—B in FIG. 2.

FIG. 1 is a schematic cross-sectional view showing part of the HBT, FIG. 2 is a schematic plan view of a semiconductor device comprising the HBT, FIG. 3(a) is a cross-sectional view take along a line A—A in FIG. 2, and FIG. 3(b) is a cross-sectional view taken along a line B—B in FIG. 2.

The heterojunction bipolar transistor (HBT) of the first embodiment has the structure shown in FIG. 3.

The HBT, as shown in FIGS. 3(a) and 3(b), comprises a subcollector layer selectively formed of n+ type GaAs n+-type GaAs subcollector layer) on one surface (the main surface) of a substrate (semiconductor substrate: semi-insulating GaAs substrate) 1 of a thickness of approximately 80 μm. The thickness of the subcollector layer 2 is of the order of 600 nm.

A collector layer 3 formed of n type GaAs (n type GaAs collector layer) is provided in the center of the upper surface of the subcollector layer 2. This collector layer 3 has a thickness of the order of 800 nm.

A base layer 4 formed of p+-type GaAs (p+-type GaAs base layer) is provided on the upper surface of and overlapping the collector layer 3. The collector layer 3 and base layer 4 have identical patterns. The base layer 4 has a thickness of the order of 50 nm.

An emitter layer formed of n-type InGaP (n-type InGaP emitter layer) 5 is provided on the base layer 4. The thickness of this emitter layer 5 is of the order of 15 to 30 nm, e.g. approximately 30 nm.

The edge part of the base layer 4 surrounding the emitter layer 5 is exposed. An inner edge part of a base electrode 9 overlaps the edge part of the base layer 4 from the edge part of the emitter layer 5.

An emitter cap layer 6 is formed on the upper surface of the emitter layer 5, The emitter cap layer 6 may comprise plural semiconductor layers, such as an n-type GaAs layer or n-type GaAs layer and InGaAs layer (upper layer). For example, in this first embodiment, although not shown in the drawings, there are two layers, i.e., a lower layer of n-type GaAs and an upper layer of n-type InGaAs. Further, the lower layer may comprise two layers, i.e., n-type GaAs layers of low concentration and high concentration, the low concentration n-type GaAs layer being used as a ballast resistance to prevent overheating of the device. The two-layer emitter cap layer 6 has a thickness of the order of 300 nm.

An emitter electrode 7 is formed on the upper surface of the emitter cap layer 6. The lower layer of this emitter electrode 7 is a first electrode layer 8a, and the upper layer is a second electrode layer 8b.

As the emitter cap layer 6 is formed by side etching, specifically by wet etching using the first electrode layer 8a selectively provided on the emitter cap layer 6 as a mask, the edge of the emitter cap layer 6 is formed further inside than the edge of the first electrode layer 8a. This recess length a (see FIG. 1) is, for example, of the order of 0.2 μm.

The second electrode layer 8b and base electrode 9 are electrode layers formed by a lift-off technique on the main surface side of the semi-insulating GaAs substrate 1. Specifically, as there is a large step between the surface of the emitter layer 5 and surface of the first electrode layer 8a, the electrode layer breaks off in this step part, and the electrode layer remaining on the first electrode layer 8a forms the second electrode layer 8b. Pieces of electrode layers which have fallen off extend from the edge part of the emitter layer 5 across the base layer 4. An unnecessary electrode layer is subsequently patterned by lift-off technique to form the base electrode 9, as shown in FIGS. 3(a) and 3(b).

As the edge of the first electrode layer 8a projects beyond the edge of the emitter cap layer 6, the base electrode 9 and emitter cap layer 6 are situated at a fixed distance apart. This distance is of the same order as the aforesaid recess length a.

The first electrode layer 8a and base electrode 9 are formed of WSi which has a thickness of 300 nm, and the second electrode layer 8b is formed of Pt/Ti/Mo/Ti/Pt/Au having Pt as the lowermost layer. The second electrode layer 8b has an overall thickness of the order of 300 nm.

The thicknesses of the layers of the second electrode layer 8b may, for example, be Pt (15 to 30 nm)/Ti (1 to 30 nm)/Mo (10 to 15 nm)/Ti (30 to 60 nm)/Pt (30 to 60 nm)/Au (100 to 200 nm).

In the HBT of the first embodiment, heat treatment is performed midway during the manufacturing process to alloy the Pt of the lowermost layer of the second electrode layer 8b and the n-type InGaP emitter layer 5. Alloy is formed through the whole depth of the n-type InGaP emitter layer 5 so that an alloy layer 21 extends to the upper part of the base layer 4, which is the layer under the n-type InGaP emitter layer 5 (FIG. 1).

Since this alloy layer 21, which is close to the base-collector junction interface, has a uniform depth which is less than the depth of the base layer in the base layer, there is no contact with the collector layer and the breakdown voltage is maintained at a high level.

As alloy is also formed in the surface direction of the n type InGaP emitter layer 5. The distance between the intrinsic region immediately below the emitter cap layer 6 and the alloy layer 21 is short so the base resistance $R_B$ is decreased and the device (HBT) can operate at high speed (FIG. 1).

Collector electrodes 13 are further provided on the subcollector layer 2.

The second electrode layer 8b and base electrode 9 comprise Pt/Ti/Mo/Ti/Pt/Au, where Pt is the lowermost layer, and the relations between the thicknesses of the lowermost layer Pt, the n-type InGaP emitter layer 5, and the p$^+$-type GaAs base layer 4 are such that the equations $t_{Pt} \geq 2t_E$, tB>2t$_{Pt}$, are satisfied where the base layer thickness is $t_B$, and the thickness of the Pt of the lowermost layer of the base electrode is $t_{Pt}$. As a result, the alloy layer 21 extends through the emitter layer 5 so that it can be ohmically joined with the base layer 4, and the alloy layer 21 stops inside the base layer 4 so that it is not electrically in contact with the collector layer 3.

The electrode material forming the second electrode layer 8b and base electrode 9 has Pt as the lowermost layer, Ti/Mo/Ti/Pt having the function of preventing metal in the upper layers from diffusing into the lower layers during heat treatment. Hence, during alloying, the diffusion of Ti, Mo, and Au into the n-type InGaP emitter layer 5 and p$^+$-type GaAs base layer 4 is reduced, and does not cause degeneration of device characteristics.

The main surface side of the semi-insulating GaAs substrate 1 is covered by a thick insulating film 14. This insulating film 14 is formed, for example, of an insulating polyimide resin. The polyimide resin is coated, cured and smoothed by an etch-back method, and contact holes are formed in it. Interconnections 15 are then formed using an electrically conducting material (e.g. Au) in the contact hole parts and the exposed parts of the emitter electrode 7.

FIG. 2 is a drawing of a semiconductor device and HBT showing the layout of the interconnections 15 and external electrode terminals, i.e., it is a schematic plan view of a semiconductor chip 16.

The parts shown by double dotted lines in the center of the semiconductor chip 16 are the interconnections 15 (emitter interconnections 15E) connected to the emitter electrode 7, and a rectangular part shown by solid lines inside the interconnection 15E is an emitter electrode pad BP$_E$, which is an external electrode terminal.

The large rectangular part shown by a solid line surrounding an emitter electrode 7 is the base electrode 9, the part shown by a double dotted line crossing it is the interconnection 15 (base interconnection 15B), and the rectangular part shown by a solid line inside this is a base electrode pad BPB which is an external electrode terminal.

The part patterned in the shape of a right-angled arch shown by solid lines extending around the upper part of the base interconnection 15B is the collector electrode 13, the part shown by a double dotted line crossing it is the interconnection 15 (collector interconnection 15C), and the rectangular part shown by a solid line in the center of this is a collector electrode pad BP$_C$, which is an external electrode terminal.

Next, the method of fabricating the semiconductor device comprising a HBT according to the first embodiment will be described.

FIGS. 4–9 are schematic cross-sectional views of a semiconductor substrate, showing each stage of the method of fabricating the HBT of the first embodiment. The cross-section is taken along the direction of the line A—A in FIG. 2.

Figure 4:
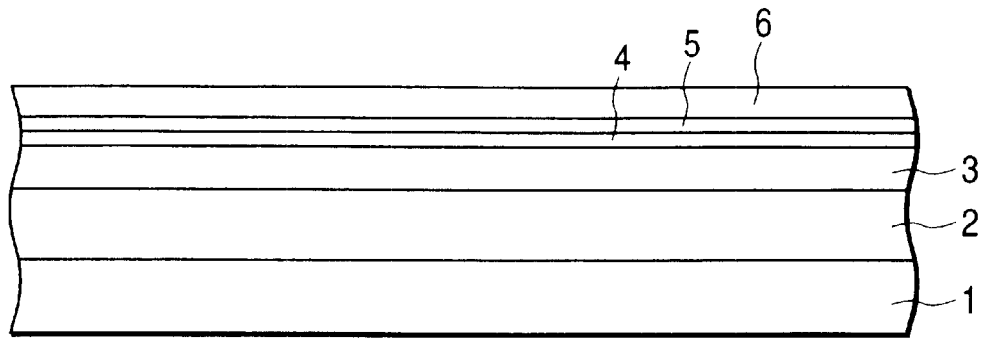
FIG. 4 is a schematic cross-sectional view showing a state in which semiconductor layers comprising a collector layer, base layer, and emitter layer are successively formed on the main surface of a semiconductor substrate in the construction of the HBT in the first embodiment.

As shown in FIG. 4, semiconductor layers are successively formed by the MOCVD method or the MBE method on the main surface of the semi-insulating GaAs substrate 1 having a thickness of the order of 600 μm, i.e., the subcollector layer 2 comprising n$^+$-type GaAs {impurity (Si) concentration approximately $5 \times 10^{18}$ cm$^{-3}$, thickness approximately 600 nm}, the collector layer 3 comprising n-type GaAs {impurity (Si) concentration approximately $10^{16}$ cm$^{-3}$, thickness approximately 800 nm}, the base layer 4 comprising p$^+$-type GaAs {impurity (C) concentration approximately $4 \times 10^{19}$–$1 \times 10^{20}$ cm$^{-3}$, thickness approximately 50 nm}, the emitter layer 5 comprising InGaP {impurity (Si) concentration approximately $3 \times 10^{17}$ cm$^{-3}$, thickness approximately 30 nm}, and the emitter cap layer 6 comprising n-type GaAs {thickness approximately 300 nm}.

Although not shown, according to the first embodiment, the emitter cap layer 6 comprises a lower n-type GaAs layer and an upper n-type InGaAs layer. Further, the lower n-type GaAs layer comprises both a low concentration layer and a high concentration layer.

Figure 5:
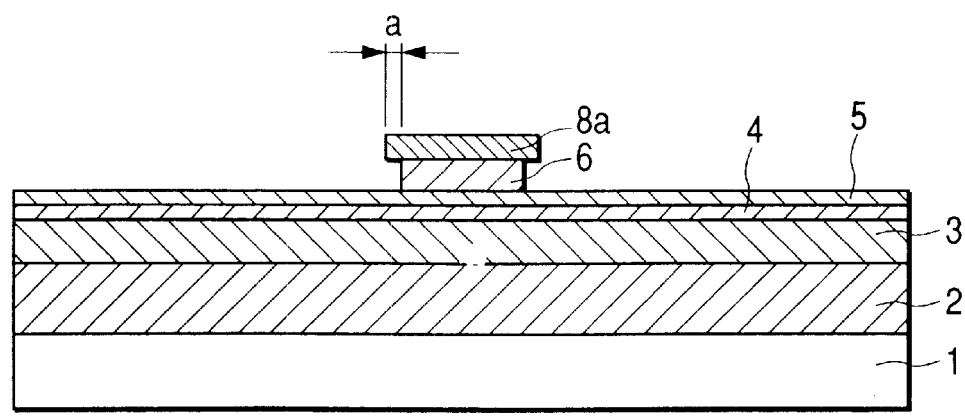
FIG. 5 is a schematic cross-sectional view of the semiconductor substrate on which an emitter electrode and an emitter cap layer are formed in the construction of the HBT in the first embodiment.

Next, as shown in FIG. 5, the first electrode layer 8a, which is the lower layer of the emitter electrode, is formed by a common electrode layer forming technique such as photo lithography and etching on the semiconductor layer, which is the emitter cap layer 6. Etching is then performed using this first electrode layer 8a as an etching mask to form the emitter cap layer 6, whereof the periphery lies further inside than the edge of the first, electrode layer 8a (recess length a). The recess length a is f or example of the order of 0.2 μm. The first electrode layer 8a is, for example, formed of WSi having a thickness of the order 300 nm.

Figure 6:
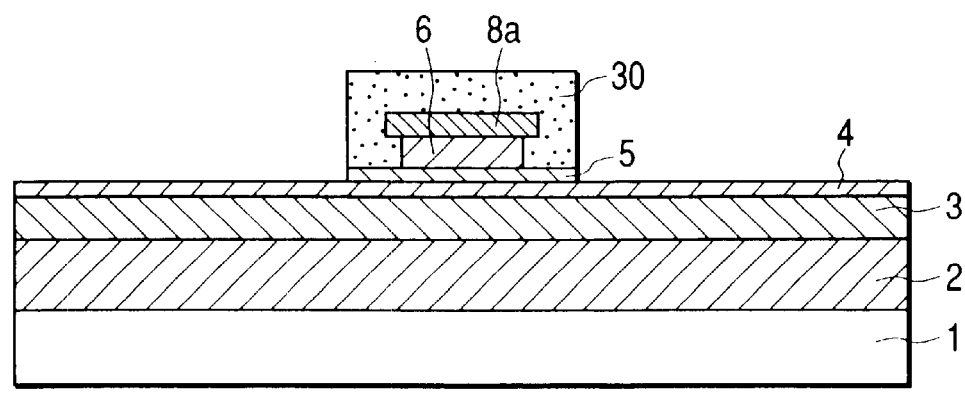
FIG. 6 is a schematic cross-sectional view of the semiconductor substrate wherein an emitter layer is formed by etching with hydrochloric acid in the construction of the HBT in the first embodiment.
Figure 18:
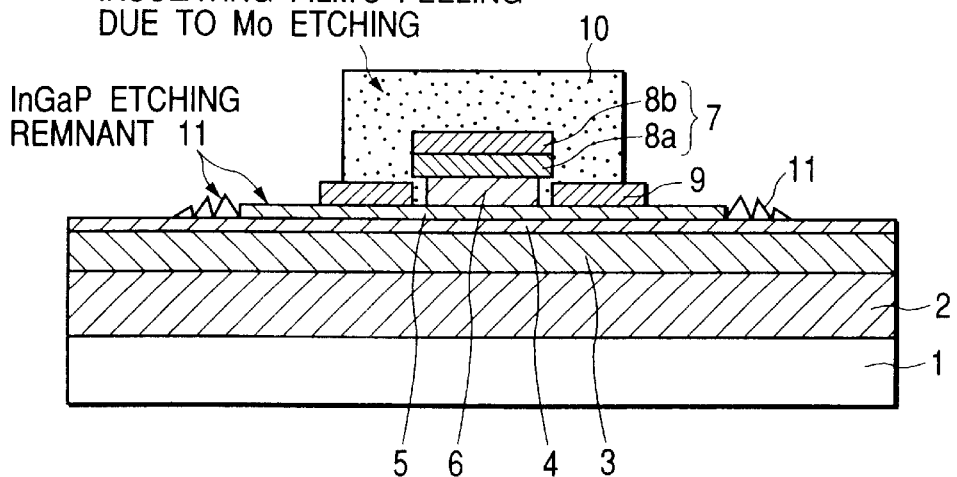
FIG. 18 is a schematic view showing defects which occur during wet etching of the InGaP emitter layer in a trial fabrication of the HBT performed by the Inventor.
Figure 19:
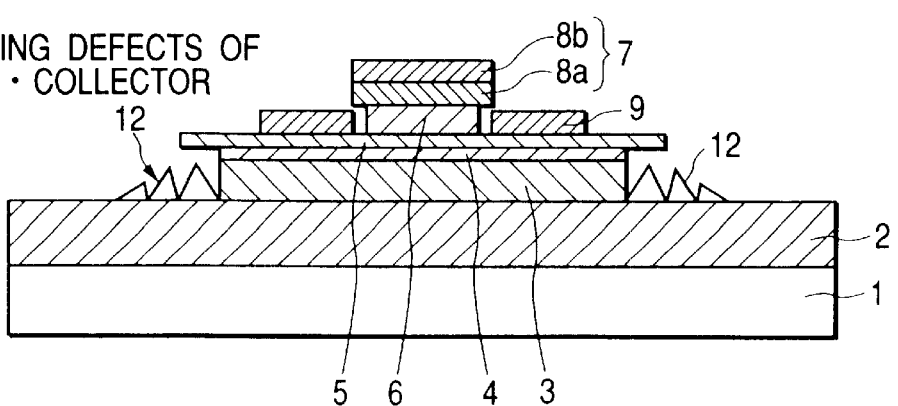
FIG. 19 is a schematic view showing defects which occur during undercut wet etching of the base layer and collector layer in a trial fabrication of the HBT performed by the Inventor.

Next, as shown in FIG. 6, an etching mask 30 comprising an insulating film is formed on the InGaP emitter layer 5 so as to cover the emitter cap layer 6 and first electrode layer 8a. Wet etching is then performed by hydrochloric acid using this etching mask 30 to etch the n-type InGaP emitter layer 5 and expose the surface of the p$^+$-type GaAs base layer 4. According to the first embodiment, as the base electrode is not yet formed, corrosion of Ti or Mo, which are base electrode materials, does not occur, so etching can be performed with high precision according to the specifications of the etching mask 30 without any obstruction caused by substances due to corrosion. Therefore, the remnants shown in FIG. 18 are not easily produced. The etching mask 30 may be formed, for example, of an SiO2 film having a thickness of the order of 200 nm. The emitter cap layer 6 and first electrode layer 8a are situated in the center of the etching mask 30.

Next, after removing the etching mask 30, a photoresist mask is formed over the whole area of the main surface side of the semi-insulating GaAs substrate 1, and the electrode layer is lifted off to a predetermined pattern. As the step between the surface of the emitter layer 5 and surface of the first electrode layer 8a is large, the electrode layer is broken off in the step part to form a part on the first electrode layer 8a, and also a part extending over the emitter layer 5 and base layer. The electrode layer extending over the emitter layer 5 and base layer 4 is then patterned. As a result, as shown in FIG. 7, the second electrode layer 8b, which exactly overlaps the first electrode layer 8a, forms the emitter electrode 7 together with the first electrode layer 8a, and the electrode layer overlapping the emitter layer 5 and base layer 4 forms the base electrode 9.

As the edge of the first electrode layer 8a projects beyond the edge of the emitter cap layer 6, the base electrode 9 and emitter cap layer 6 are situated at a fixed distance apart. This distance is of the order of the aforesaid recess length a.

The aforesaid electrode layer is formed of Pt/Ti/Mo/Ti/Pt/Au, having Pt as the lowermost layer as described heretofore.

Figure 7:
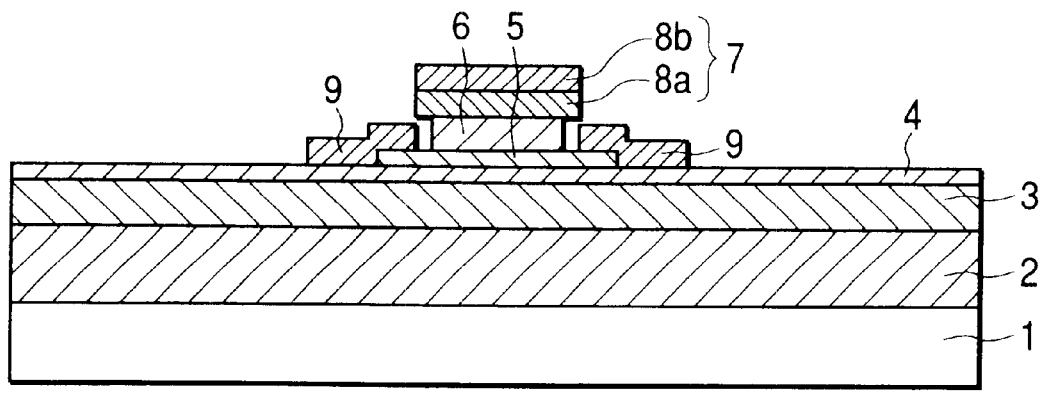
FIG. 7 is a schematic cross-sectional view of the semiconductor substrate wherein a base electrode is formed in the construction of the HBT in the first embodiment.

The width of the emitter electrode 7, shown in FIG. 7, is of the order of 1.0 μm, and the length of the base electrode 9 on both sides is respectively of the order of 1.0 μm. Therefore, the length from outer edge to outer edge of the base electrode 9 is of the order of 3.0 μm.

Next, this semiconductor substrate 1 is heat-treated, and the InGaP emitter layer 5 under the base electrode 9 is alloyed over its whole thickness. The heat treatment is, for example, performed in a nitrogen atmosphere at a temperature of approximately 350+ C. for about 30 minutes. As a result, as shown in FIG. 1, the InGaP emitter layer 5 directly under the base electrode 9 is completely replaced by the alloy layer 21, and the surface part of the base layer 4 under this also becomes the alloy layer 21. Moreover, the surface part of the base layer 4 with which the base electrode 9 is in direct contact also becomes the alloy layer 21. However, the alloying conditions and layer thicknesses are set so that the alloy layer 21 does not reach the collector layer 3 or reach a distance at which it would cause an electrical obstruction.

The electrode layer 8b and base electrode 9 comprise Pt/Ti/Mo/Ti/Pt/Au, having Pt as the lowermost layer, and the thicknesses of the Pt of the lowermost layer, the n-type InGaP emitter layer 5, and the p$^+$-type GaAs base layer 4 satisfy the relations $t_{Pt} \geq 2t_E$, and $tB > 2t_{Pt}$, when the thickness of the InGaP emitter layer is $t_E$, the thickness of the base layer is $t_B$, and the thickness of the Pt of the lowermost layer of the base electrode is $t_{Pt}$. Consequently, the alloy layer 21 extends through the emitter layer 5 to permit an ohmic contact with the base layer 4, and the alloy layer 21 stops inside the base layer 4 so that it is not electrically in contact with the collector layer 3. The alloy layer 21 has a uniform depth which is less than the depth of the base layer in the base layer near the base-collector junction interface due to the selection of heat treatment conditions, so the base-collector breakdown voltage of the device is maintained at a high level.

Further, as alloy is also formed in the surface direction of the n-type InGaP emitter layer 5, the distance from the intrinsic region immediately under the emitter cap layer 6 to the alloy layer 21 is short, the base resistance $R_B$ is decreased, and the device (HBT) can operate at high speed.

The decrease of base resistance permits an increase of maximum effective power ($G_{Amax}$) or maximum oscillation frequency ($f_{max}$), as shown by formulae given later.

Figure 8:
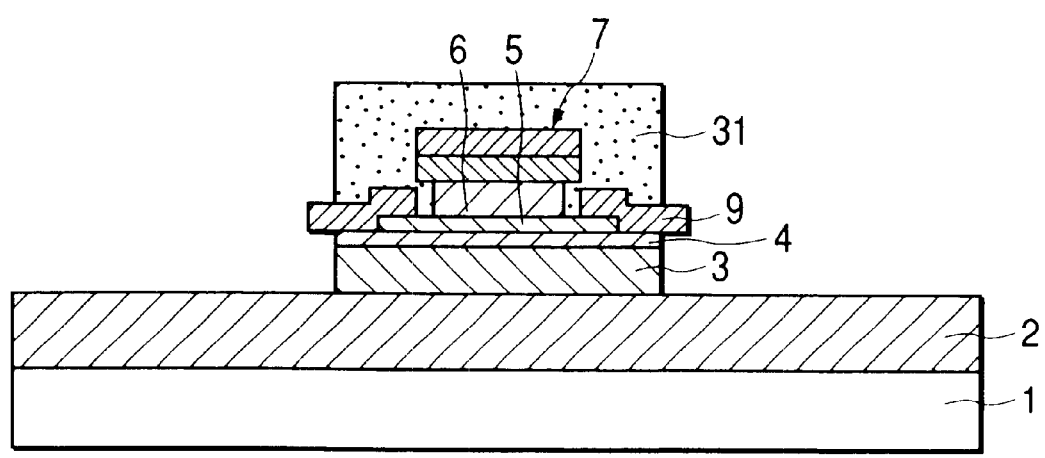
FIG. 8 is a schematic cross-sectional view of the semiconductor substrate wherein a base mesa having an undercut structure is formed by etching with phosphoric acid in the construction of the HBT in the first embodiment.

Next, as shown in FIG. 8, an etching mask 31 is formed so that the outer edge of the base electrode 9 projects by, for example, 0.5 μm, and the p$^+$-type GaAs base layer 4 and n type GaAs collector layer 3 are etched by wet etching using phosphoric acid. The base layer 4 and the collector layer 3 have substantially identical patterns. As in the case of the aforesaid etching mask 30, this etching mask 31 is also formed of an SiO$_2$ film having a thickness of the order of 200 nm.

Due to this etching, the edges of the collector layer 3 and base layer 4 form an undercut structure in which they are situated further inside than the outer edge of the base electrode 9, and due to a decrease of the base-collector junction area, the base-collector capacitance is reduced.

The performance indicators of an HBT are represented by the maximum effective power ($G_{Amax}$: maximum power obtained at a frequency f), current gain cut-off frequency ($f_t$: frequency at which the current gain is 1), and maximum oscillation frequency ($f_{max}$: frequency at which $G_{Amax}$ is 1). These are given by the following equations.

$$G_{Amax} = \frac{1}{8\pi R_B C_{BC}} \cdot \frac{f_T}{f} \quad \text{[Equation 1]}$$

Herein, $R_B$ is the base resistance, and $C_{BC}$ is the base-collector capacitance.

$$f_T = \frac{1}{2\pi(\tau_E + \tau_B + \tau_C + \tau_X)} \quad \text{[Equation 2]}$$

Herein, $\tau_E$ is an emitter charging time, $\tau_B$ is a base transit time, $\tau_C$ is a collector transit time, and $\tau_X$ is a collector charging time.

$$f\max = [ft/(8\Pi R_B C_{BC})]^{1/2} \quad \text{[Equation 3]}$$

From Equation 3, the device can be used at higher frequency such as $f_{max}$.

$f_T$ varies according to the structure of the base layer and collector layer or base-collector junction length, and although it is not necessarily true in all cases, according to the first embodiment, the base-collector junction surface area can be reduced (i.e., shrunk) to about ⅔, so the base-collector capacitance can also be reduced to about ⅔.

Therefore, according to the first embodiment, the capacitance can be reduced to ⅔ of the value in the prior art, and from Equation 3, fmax can be increased by approximately 1.2 times. By increasing the undercut amount, fmax can be increased still further.

Figure 9:
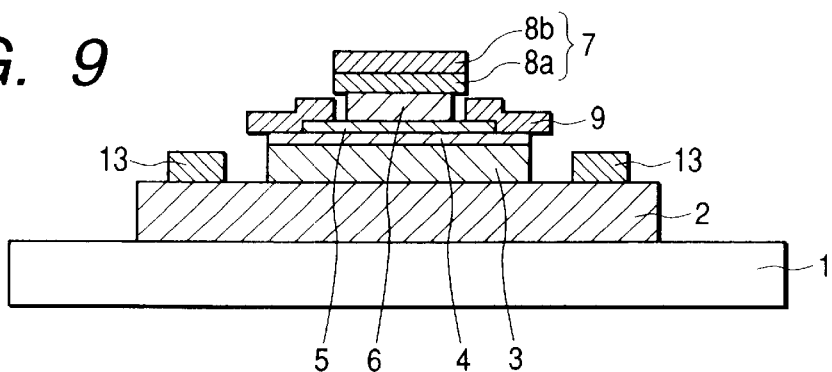
FIG. 9 is a schematic cross-sectional view of the semiconductor substrate wherein collector electrodes are formed in the construction in the HBT of the first embodiment.

Next, as shown in FIG. 9, after forming an etching mask, (not shown), the area around the subcollector layer 2 on the semi-insulating GaAs substrate 1 is etched so as to isolate the device, and the collector electrodes 13 are formed on the subcollector layer 2.

Next, the main surface side of the semi-insulating GaAs substrate 1 is covered by an insulating film 14 comprising for example, an insulating polyimide resin. This insulating film 14 is cured and smoothed by etch-back method, and after forming contact holes, the interconnections 15 of an electrically conducting material (e.g., Au) are provided in a part including the contact holes and the exposed part of the emitter electrode 7 (FIG. 3).

The pattern of the interconnections 15 is formed as shown in FIG. 2. This part was described earlier, and its description will not be repeated here.

Next, the back surface of the semi-insulating GaAs substrate 1 is etched so that the thickness of the semi-insulating GaAs substrate 1 is of the order of 80 μm, and the semi-insulating GaAs substrate 1 is cut off to form the semiconductor device shown in FIG. 2 and FIG. 3, i.e., to form the semiconductor chip 16.

Figure 10:
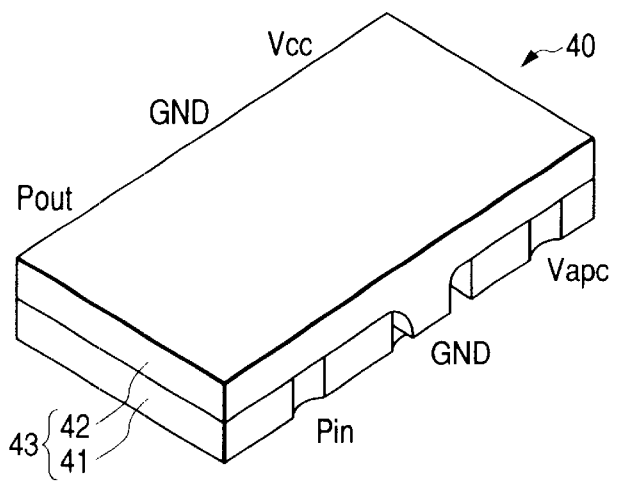
FIG. 10 is a perspective view showing an RF power amplifier into which the HBT of the first embodiment is built.

FIG. 10 is a perspective view showing an RF power amplifier (transmitting power amplifier) comprising plural HBT according to the first embodiment in subordinate connection.

An RF power amplifier 40 according to the first embodiment has a flat rectangular construction when viewed externally, as shown by the perspective view in FIG. 10. The RF power amplifier 40 comprises a flat rectangular package 43 formed by a plate-like interconnection substrate 41 and a cap 42 fitted to overlap one surface (the main surface) of this interconnection substrate 41. The cap 42 is constructed of metal has the function of providing an electromagnetic shield.

External electrode terminals (electrode terminals), which are electrically isolated from the package 43, project from the structure. Specifically, in this example, surface fitting external electrode terminals are provided from lateral surfaces to the undersurface of the interconnection substrate 41. This external electrode terminal is formed from an interconnection formed on the surface of the interconnection substrate, and from PbSn solder or the like formed on the surface of this interconnection.

The external electrode terminals, as shown in FIG. 10, comprise an input terminal (Pin), ground terminal (GND), and control terminal (Vapc) in sequence from left to right on one edge of the package 43, and an output terminal (Pout), ground terminal GND and power terminal (Vcc) in sequence from left to right on the other edge of the package 43.

Figure 11:
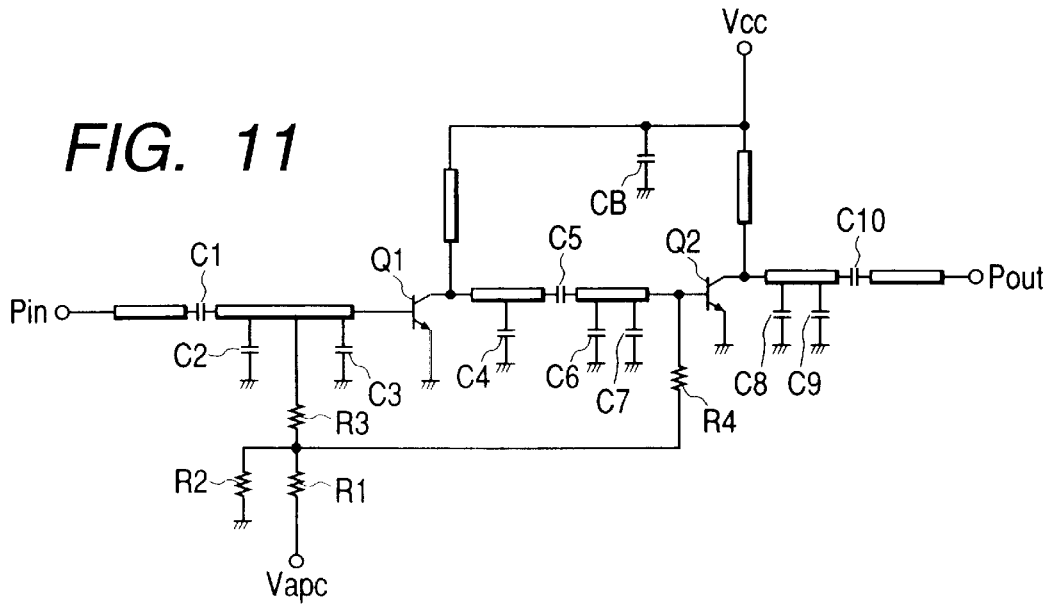
FIG. 11 is an equivalent circuit diagram of the RF power amplifier of the first embodiment.

The RF power amplifier 40, as shown by the equivalent circuit in FIG. 11, comprises a multistage amplifier wherein plural heterojunction bipolar transistors according to the first embodiment are successively connected together subordinately. Although not shown, the interconnection substrate 41 is a multistage interconnection substrate wherein the semiconductor chip 16, on which heterojunction bipolar transistors are formed, and condensers and resistances, are fixed onto one surface (inner surface) of the interconnection substrate 41. The equivalent circuit of FIG. 11 comprises condensers (C1–C10), a bypass condenser (CB), and resistances (R1–R4) which are built-in for the purpose of alignment or potential adjustment of each part. Q1 and Q2 are heterojunction bipolar transistors, and the white enclosures are microstrip lines.

The RF power amplifier 40 according to the first embodiment is used at a transmitting frequency of, for example, 800 MHz to 2 GHz, and its characteristics are supply voltage 2.7–4.2 V, output 28–32 dBm, and efficiency 55–60%.

Figure 12:
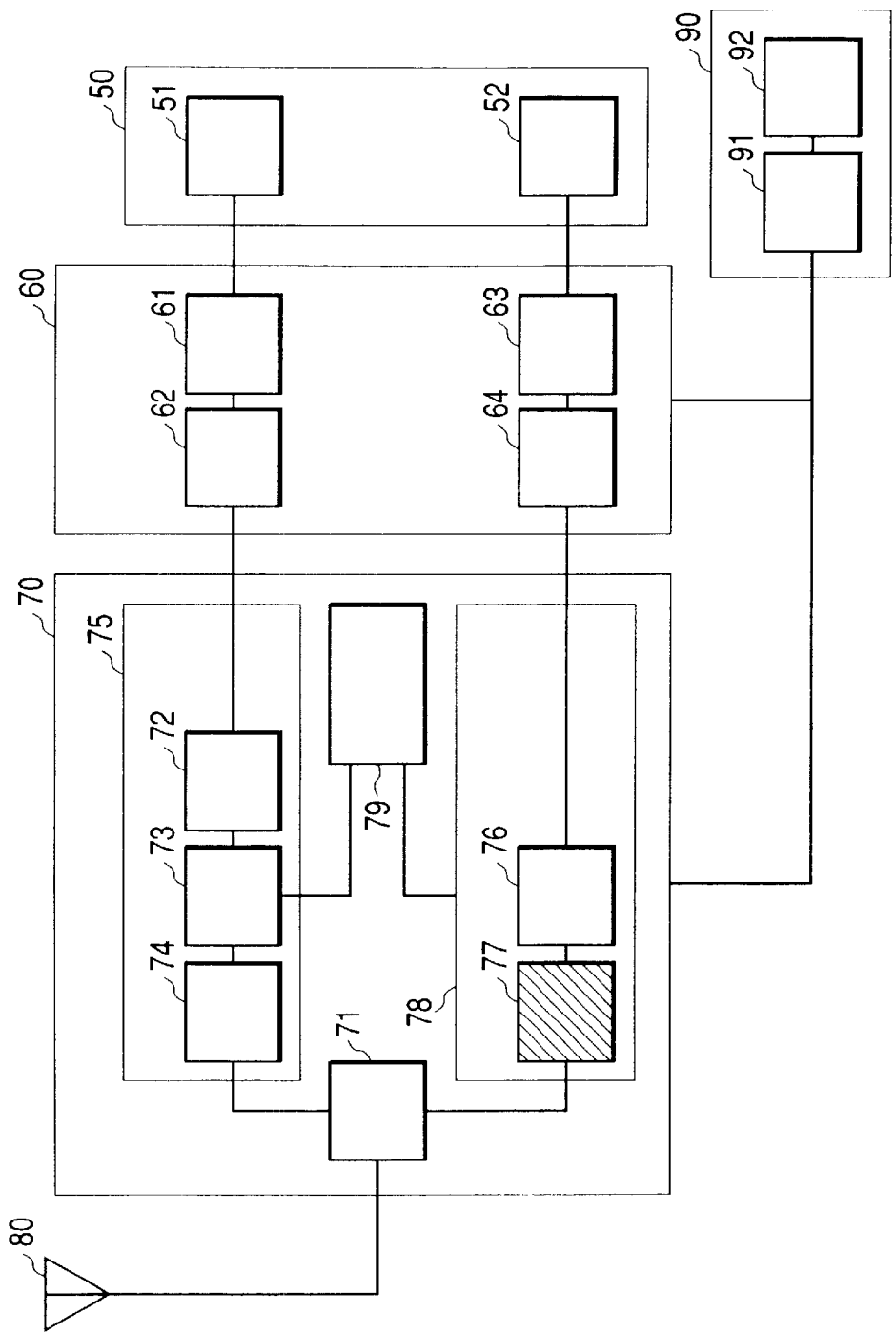
FIG. 12 is a block diagram showing the system layout of a cellular telephone into which a transmitting power amplifier comprising the HBT of the first embodiment is built.

FIG. 12 is a block diagram showing the layout of a mobile communication system comprising an HBT according to the first embodiment. Specifically, FIG. 12 shows the system layout of a cellular telephone. The RF power amplifier built into this cellular telephone is the aforesaid RF power amplifier 40, comprising the HBT according to the first embodiment.

The cellular telephone comprises a transmitter/receiver unit 50 comprising a receiver handset 51 and transmitter handset 52, a baseband unit 60 comprising a received signal processor 61 and demodulator 62, sequentially connected to the receiver handset 51, and a transmission signal processor 63 and modulator 64, sequentially connected to the transmitter handset 52, an RF block unit 70 connected to the baseband unit 60, an antenna 80 connected to the RF block unit 70, a controller 90 comprising a control circuit connected to the baseband unit 60 and RF block unit 70, and display keys 92.

An antenna switch 71 is provided to the RF block unit 70. This antenna switch 71 is connected to an RF amplifier 74 of a receiver part comprising an IF amplifier 72, received signal mixer 73, and the RF amplifier 74, to a transmission signal power amplifier 77 of a transmitter part 78 comprising a transmitting signal mixer 76 and the transmission signal power amplifier (RF power amplifier) 77, and also to the antenna 80.

The received signal mixer 73 and transmission signal mixer 76 are connected to a frequency synthesizer 79.

In the transmitting system, speech (an audio signal) that is spoken into the transmitter handset 52 is converted to an electrical signal in the transmitter handset 52, converted to a transmission signal in the transmission signal processor 63, and converted from analog to digital in the modulator 64. Next, the transmission signal is converted to a desired frequency in the frequency synthesizer 79 by the transmission signal mixer 76 of the transmitter part 78, amplified by the RF power amplifier (transmission signal power amplifier) of the first embodiment, and then transmitted as a radio wave from the antenna 80 by changing over the antenna switch 71.

In the receiving system, a received signal captured by the antenna 80 is amplified by the RF power amplifier 74 of a receiving unit 75 by changing over the antenna switch 71, and is then converted to a desired frequency by the frequency synthesizer 79 in the received signal mixer 73. Next, the received signal is amplified by the IF amplifier 72, converted from a digital signal to an analog signal by the demodulator 62 of the baseband unit 60, processed by the received signal processor 61, and then converted to an audio signal by the receiver handset 52.

In the cellular telephone according to the first embodiment, the RF power amplifier 77 operates at high speed, so a high volume of information can be transmitted.

The first embodiment has the following advantages:

(1) As the InGaP emitter layer 5 is etched before forming the base electrode 9, corrosion of the Mo or Ti forming the base electrode 9 does not easily arise, and degeneration of the electrode does not easily occur. Corrosion of the base electrode 9 does not occur in the etching by phosphoric acid, which is carried out subsequently.

(2) Since corrosion of Ti or Mo does not easily arise, degeneration of the base electrode 9 does not easily occur, the mask on the electrode does not easily peel away, the InGaP emitter layer 5 is not easily etched between the emitter cap layer and the base electrode 9, and the decline in the characteristics of the heterojunction bipolar transistor is reduced.

(3) As substances caused by the corrosion of Ti or Mo do not impair the etching effect, the InGaP emitter layer 5 is etched to high precision according to the specifications of the etching mask, and InGaP remnants are not easily produced. As a result, the undercut etching precision of the base layer 4 and collector layer 3 by phosphoric acid is also satisfactory, and the base-collector capacitance can be formed according to design specifications. Therefore, a heterojunction bipolar transistor with very high speed can be provided.

(4) Since corrosion of the base electrode 9 does not easily arise and the etching mask does not easily peel away during etching, the HBT fabrication process is stable, and as yield is improved, the cost of fabricating the semiconductor device (heterojunction bipolar transistor) can also be reduced.

(5) The base electrode 9 is formed from the edge part of the n-type InGaP emitter layer 5 across the base layer 4, the n-type InGaP emitter layer 5 under the base electrode is alloyed with the metal in the lowermost layer forming the base electrode 9 (alloying) and the depth of this alloyed layer on the side close to the base-collector junction interface is made uniform, so the breakdown voltage is high.

(6) As alloy is also formed in the surface direction of the n-type InGaP emitter layer 5, the distance between the intrinsic region of the base layer part immediately beneath the emitter cap layer 6 and the alloy layer 21 is shorter than the distance to the base electrode 9, the base resistance RB is decreased, and the device (HBT) can therefore operate at high speed.

(7) The RF power amplifier 40, into which the heterojunction dipolar transistor of the first embodiment is built, is an RF power amplifier having high-speed operation, good characteristics and high reliability.

(8) As the RF power amplifier 40 operates at high-speed, cellular telephones into which the RF power amplifier 40 of the first embodiment is built can transmit a higher volume of information.

(Embodiment 2)

Figure 13:
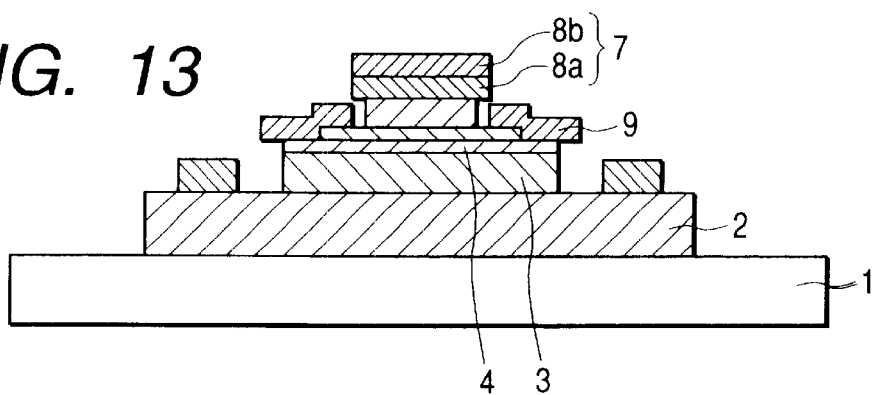
FIG. 13 is a schematic cross-sectional view showing the essential parts of an HBT according to another embodiment (Embodiment 2) of this invention.
Figure 14:
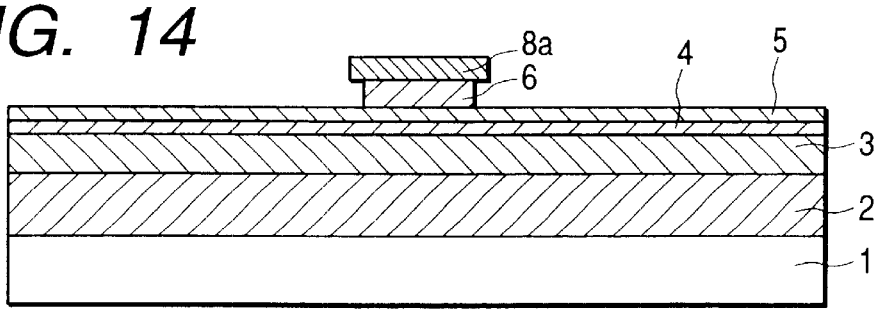
FIG. 14 is a schematic cross-sectional view of the semiconductor substrate on which the emitter electrode and the emitter cap layer were formed in a trial fabrication of the HBT performed by the Inventor.
Figure 15:
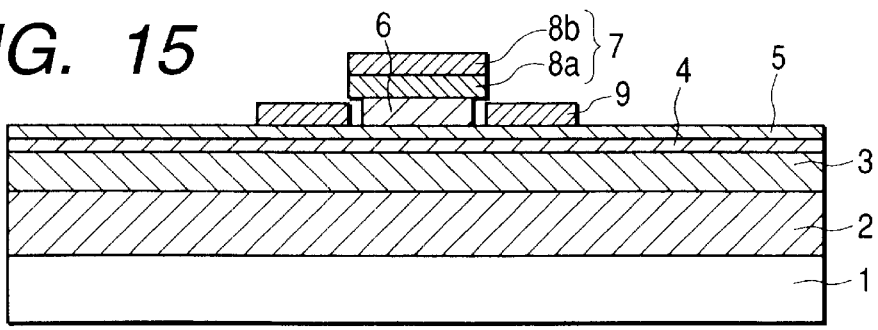
FIG. 15 is a schematic cross-sectional view of the semiconductor substrate on which the base electrode was formed in a trial fabrication of the HBT performed by the Inventor.
Figure 16:
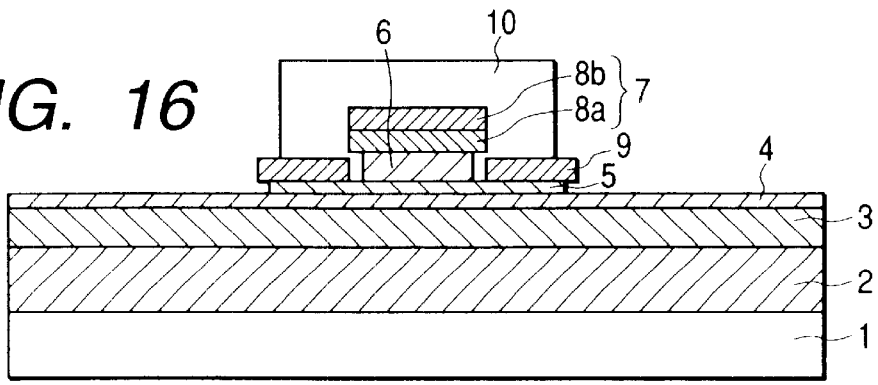
FIG. 16 is a schematic cross-sectional view of the semiconductor substrate wherein the emitter layer was etched, in a trial fabrication of the HBT performed by the Inventor.
Figure 17:
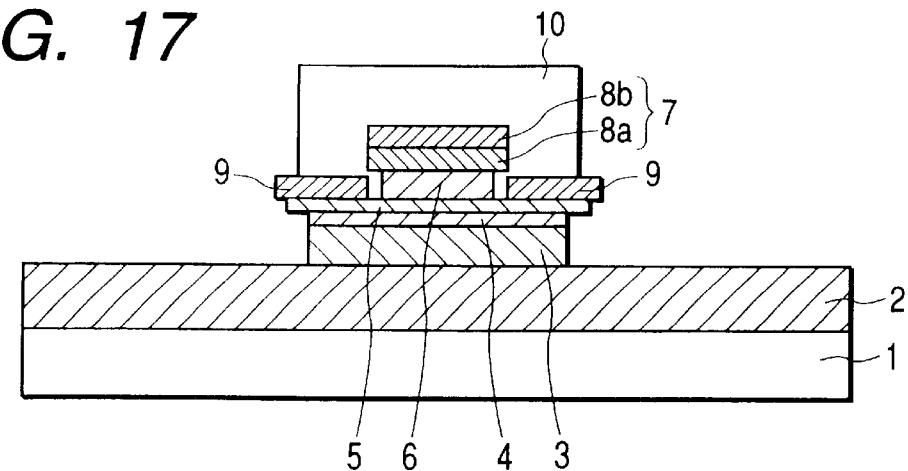
FIG. 17 is a schematic cross-sectional view of the semiconductor substrate wherein the base layer and the collector layer were subjected to undercut etching in a trial fabrication of the HBT performed by the Inventor.

FIG. 13 is a schematic cross-sectional view of essential parts of an HBT according to another embodiment (second embodiment) of this invention.

The heterojunction bipolar transistor according to the second embodiment is characterized by the fact that, as shown in FIG. 13, during the fabrication of the heterojunction bipolar transistor of the first embodiment, wet etching of the collector layer 3 and base layer 4 is performed for an even longer time. As a result, the edge of the base layer 4 is even closer to the center of the emitter layer 5, the base-collector junction area is even smaller than in the aforesaid first embodiment, and the base-collector capacitance can be further reduced.

Therefore, the speed of the heterojunction bipolar transistor can be increased still further.

The invention conceived by the Inventor has been described in detail based on the embodiments, but it will be understood that the present invention is not limited to the aforesaid embodiments, since various modifications are possible within the scope of the appended claims. For example, in the aforesaid HBT embodiments, a case was described where only the HBT was formed in the semiconductor chip, but it will be understood that active elements or passive components such as transistors having other constructions can be formed monolithically to fabricate an IC (integrated circuit device).

In the above description, the invention conceived by the Inventor was described mainly in the context of its application to a mobile communication system, which is where it was originally used, but the invention is not limited to this application, and may, for example, be applied also to an optical device employing an InGaP/GaAs heterojunction construction, or to an optical transmitting device employing an InGaP/GaAs heterojunction bipolar transistor.

This invention may be applied to semiconductor devices having at least a heterojunction construction.

ADVANTAGES OF THE INVENTION

The advantages obtained by typical examples of the invention as disclosed in this application may be briefly described as follows:

(1) In an InGaP/GaAs heterojunction bipolar transistor having an InGaP layer as the emitter layer and wherein the base electrode is electrically connected to the base layer by alloying the InGaP emitter layer, etching of the InGaP emitter layer is performed before forming the base electrode. Hence, corrosion occurring during the etching of the base electrode does not easily arise, surface degeneration of the base electrode or degeneration of the InGaP emitter layer between the base electrode and emitter cap layer does not easily occur, and the decline in the characteristics of the heterojunction bipolar transistor is reduced.

(2) As undercut etching of the base layer or collector layer under the base electrode is performed, the base-collector junction area is decreased, and the base-collector capacitance is reduced. In this way, high-speed operation of the heterojunction bipolar transistor can be achieved.

(3) By increasing the undercut to the extent that the base electrode and base layer do not come in contact with each other, the base-collector capacitance can be still further reduced.

(4) As Pt, which is the lowermost layer of the base electrode and the InGaP emitter layer are alloyed, due to the formation of an alloy layer, the distance between the intrinsic region comprising the base layer part immediately under the emitter cap layer and the alloy layer is short, the base resistance $R_B$ is decreased, and the heterojunction bipolar transistor can therefore operate at high speed.

(5) An RF power amplifier, into which the heterojunction bipolar transistor of the first embodiment is built, has enhanced high-speed performance.

(6) In a cellular telephone into which the RF power amplifier of the first embodiment is built, the RF power amplifier operates at high speed, so, as a result, a large volume of information can be transmitted.

What is claimed is:

1. A semiconductor device comprising a heterojunction bipolar transistor comprising a subcollector layer, collector layer, base layer, emitter layer and emitter cap layer successively formed in predetermined shapes on one surface of a semiconductor substrate, the transistor having a structure wherein an inner edge part of a base electrode overlaps the periphery of said emitter layer, and said base electrode is electrically connected to said base layer by an alloy layer formed by alloying said emitter layer under the base electrode, said emitter layer is selectively formed on said base layer, said base electrode extends from the peripheral part of said emitter layer across said base layer, and said alloy layer extends to a midway depth of said base layer.

2. A semiconductor device according to claim 1, wherein the edge of said base layer is situated further inside than the outer edge of said base electrode.

3. A semiconductor device according to claim 1 or 2, wherein said semiconductor substrate is formed of a semi-insulating GaAs substrate, said subcollector layer and collector layer are formed of an n type GaAs layer, said base layer is formed of a p type GaAs layer, said emitter layer is formed of an n type InGaP layer, and said emitter cap layer is formed of an n type GaAs layer.

4. A semiconductor device according to claim 1 or 2, wherein said emitter layer formed of InGaP has a thickness of the order of 15 to 30 nm.

5. A semiconductor device according to claim 1 or 2, wherein the cover part of said emitter electrode is formed of an electrode layer forming said base electrode.

6. A semiconductor device according to claim 1 or 2, wherein said base electrode is formed of Pt/Ti/Mo/Ti/Pt/Au having Pt as the lowermost layer.

7. A semiconductor device according to claim 1 or 2, wherein if the thickness of the InGaP emitter layer is $t_E$, the thickness of the base layer is $t_B$ and the thickness of the Pt of the lowermost layer of the base electrode is $t_{Pt}$, the relations $t_{Pt} \geq 2t_E$, and $t_B > 2t_{Pt}$, are satisfied.

8. An RF power amplifier incorporating a semiconductor device according to claim 1 or 2.

9. A mobile communication system incorporating an RF power amplifier according to claim 8.

* * * * *